(12) United States Patent
Mitchell et al.

(10) Patent No.: US 8,293,017 B2
(45) Date of Patent: Oct. 23, 2012

(54) METHOD AND APPARATUS FOR COATING SURFACES

(75) Inventors: Daniel B. Mitchell, Port McNicoll (CA); Geoffrey G. Harris, Midland (CA); Douglas J. Brown, Midland (CA)

(73) Assignee: Raytheon Canada Limited, Ottawa, Ontario (CA)

( * ) Notice: Subject to any disclaimer, the term of this patent is extended or adjusted under 35 U.S.C. 154(b) by 1211 days.

(21) Appl. No.: 12/101,042

(22) Filed: Apr. 10, 2008

(65) Prior Publication Data

US 2009/0258141 A1   Oct. 15, 2009

(51) Int. Cl.
*C23C 16/00* (2006.01)

(52) U.S. Cl. .................... 118/726; 118/727

(58) Field of Classification Search ............ 118/726, 118/727
See application file for complete search history.

(56) References Cited

U.S. PATENT DOCUMENTS

| | | |
|---|---|---|
| 2,410,720 A | 11/1946 | Glenn |
| 2,411,715 A | 11/1946 | Glenn |
| 3,645,771 A | 2/1972 | Ward |
| 4,982,696 A | 1/1991 | Kinoshita et al. |
| 7,062,348 B1 | 6/2006 | Folta |
| 7,122,223 B1 | 10/2006 | Comble et al. |
| 7,513,949 B2 | 4/2009 | Yamazaki et al. |
| 2006/0130760 A1 | 6/2006 | Zultzke et al. |
| 2007/0155295 A1 | 7/2007 | Igarashi et al. |
| 2007/0157883 A1 | 7/2007 | Zultzke et al. |

OTHER PUBLICATIONS

U.S. Appl. No. 12/017,909, filed on Jan. 22, 2008 by inventors Daniel B. Mitchell, Geoffrey G. Harris and Douglas J. Brown for "Method and Apparatus for Coating a Curved Surface", 21 pages of text, 2 pages of drawings.
U.S. Appl. No. 12/169,971, filed on Jul. 9, 2008 by inventors Daniel B. Mitchell, Douglas J. Brown and Geoffrey G. Harris for "Method and Apparatus for Coating Surfaces", 26 pages of text, 3 pages of drawings.

*Primary Examiner* — Keath Chen
(74) *Attorney, Agent, or Firm* — Lando & Anastasi, LLP

(57) ABSTRACT

An apparatus includes a workpiece support, a source for emitting a plume of coating material that flows toward the workpiece support, and plume influencing structure between the source and the workpiece support. The plume influencing structure includes a shield with plural openings extending therethrough approximately parallel to a general direction of flow of the plume away from the source. According to a different aspect, a method includes emitting from a source a plume of coating material that flows toward a workpiece support, and adjusting the flow of the plume with a shield between the source and the workpiece support, the shield having plural openings extending therethrough approximately parallel to a general direction of flow of the plume.

10 Claims, 2 Drawing Sheets

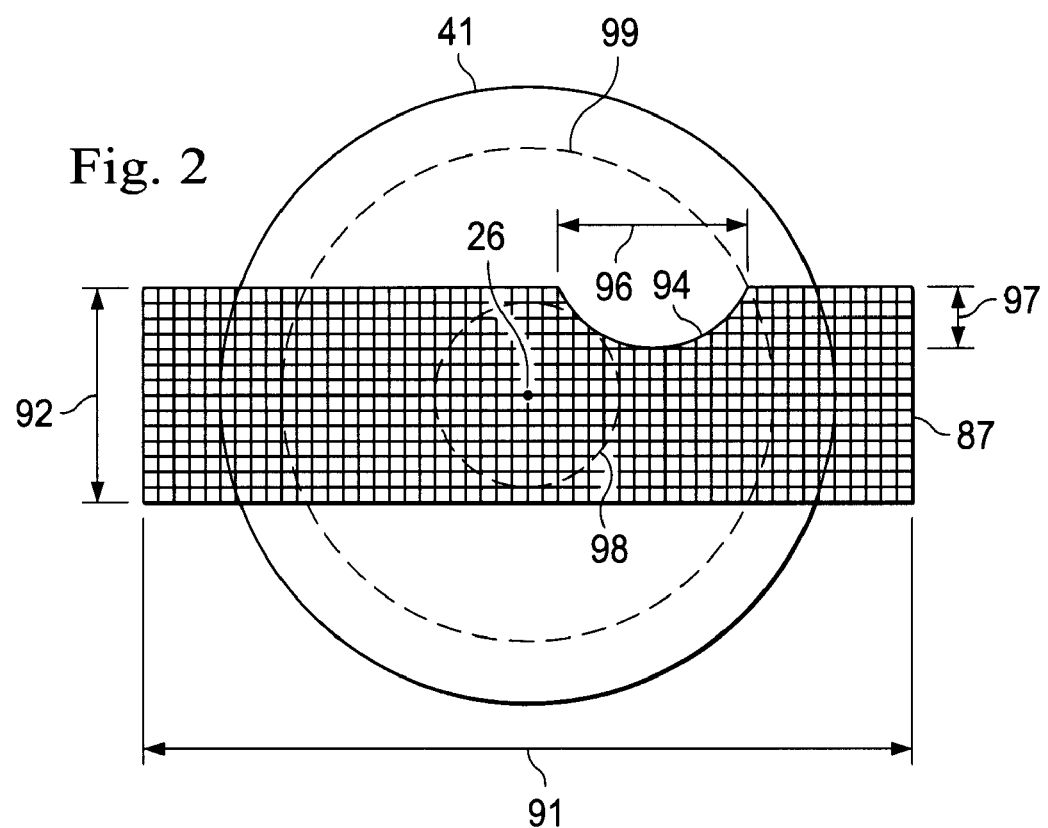
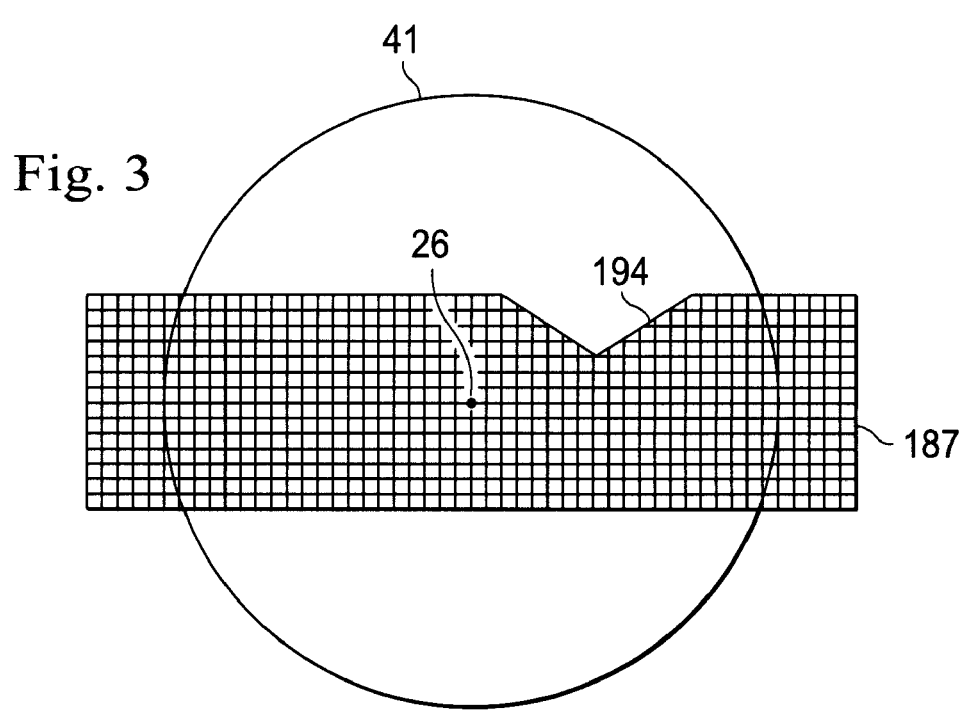

METHOD AND APPARATUS FOR COATING SURFACES

FIELD OF THE INVENTION

This invention relates in general to coating techniques and, more particularly, to techniques for coating surfaces.

BACKGROUND

When fabricating optical components such as lenses, it is very common to form a coating on a surface of the component, where the coating provides desired optical and/or physical properties. For example, the coating may provide an anti-reflective (AR) characteristic, a filtering characteristic, physical protection for the component, some other characteristic, or a combination of two or more characteristics. These coatings often include multiple layers of different materials that collectively provide the desired characteristic(s).

One problem with conventional coating techniques is that any given layer in a coating may have a thickness that is not uniform throughout the layer. As one example, when a coating is on a relatively highly curved surface, it is not unusual for a given layer of the coating to have a peripheral region that is as much as 30% to 50% thinner than a central region of that layer, or even more than 50% thinner.

In the case of an optical component, variations in the thickness of a coating layer can affect the optical performance of the coating. For example, if the coating is designed to pass light from a 1064 nm laser, it may do so in its central region where the thicknesses are correct. But a 35% thickness variation in the peripheral region can cause a corresponding variation in the wavelengths passed in the peripheral region, such that the peripheral region passes wavelengths of about 676 nm to 709 nm, rather than 1064 nm.

A further consideration is that different layers in the same coating often have different variations in thickness. For example, one layer may be 30% thinner in a peripheral region than in a central region, while another layer may be 50% thinner in the peripheral region than in the central region. Consequently, the ratios of thicknesses of different layers in the peripheral region can be different from the ratios of the thicknesses of those same layers in the central region.

Thus, even assuming that the layers all have the proper thicknesses and ratios of thickness in the central region of the coating, the thicknesses and the ratios of thicknesses in the peripheral region will typically not be correct. As a result, the coating may provide desired characteristics in the central region, but may fail to provide these desired characteristics in the peripheral region, or may at least exhibit a degradation of the desired characteristics in the peripheral region. Consequently, although pre-existing coating techniques have been generally adequate for their intended purposes, they have not been entirely satisfactory in all respects.

BRIEF DESCRIPTION OF THE DRAWINGS

A better understanding of the present invention will be realized from the detailed description that follows, taken in conjunction with the accompanying drawing, in which:

FIG. 2 is a diagrammatic bottom view showing a shield and a workpiece from FIG. 1.

FIG. 3 is a diagrammatic bottom view similar to FIG. 2, but showing the workpiece with a shield that is an alternative embodiment of the shield of FIG. 2.

DETAILED DESCRIPTION

Figure 1:
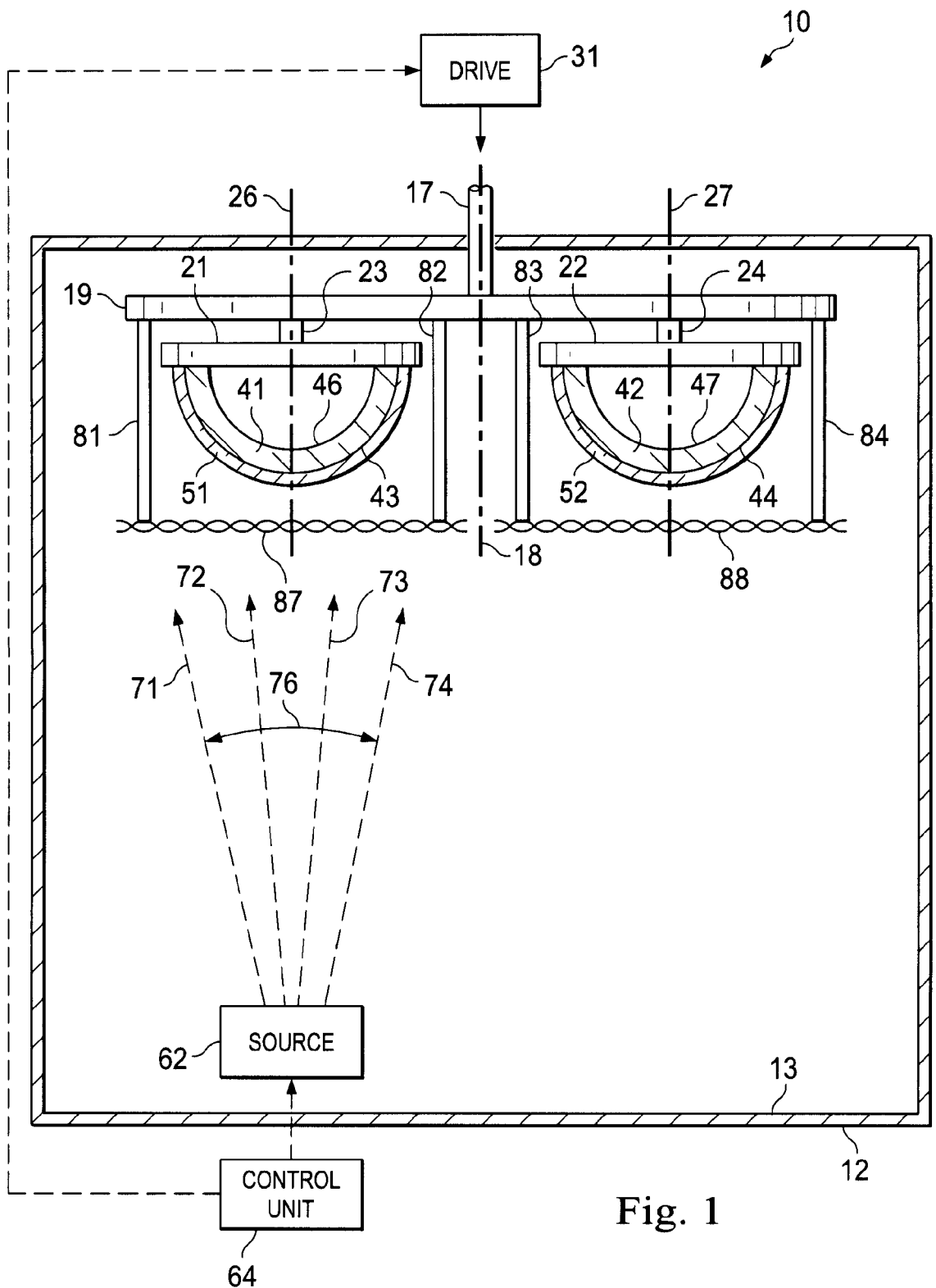
FIG. 1 is a diagrammatic sectional side view of a coating apparatus that embodies aspects of the invention.

FIG. 1 is a diagrammatic sectional side view of a coating apparatus 10 that embodies aspects of the invention. The coating apparatus 10 includes a housing 12 with a chamber 13 therein. During a typical coating operation, a vacuum is maintained in the chamber 13 by a not-illustrated vacuum pump. The housing 12 supports a primary axle 17 for rotation about a primary vertical axis 18. A support part 19 is supported on the axle 17 within the chamber 13 for rotation with the axle about the axis 18. In the disclosed embodiment, the support part 19 is disk-shaped, but it could alternatively have any other suitable shape.

The support part 19 rotatably supports two workpiece support members 21 and 22. More specifically, two additional vertical axles 23 and 24 are each rotatably supported on the support part 19. The axles 23 and 24 are spaced circumferentially from each other about the primary axle 17, and each rotate about a respective vertical axis 26 or 27. The two support members 21 and 22 are each supported on a respective one of the axles 23 and 24 for rotation therewith about the associated axis 26 or 27. In the disclosed embodiment, the support members 21 and 22 are disk-shaped, but they each could alternatively have any other suitable shape. Although FIG. 1 shows two workpiece support members 21 and 22, with respective axles 23 and 24, it would alternatively be possible to have a larger number of workpiece support members with respective axles, where the axles for all of the workpiece support members are spaced circumferentially from each other about the primary axle 17.

A drive mechanism 31 such as an electric motor is coupled to the axle 17, in order to effect rotation of the axle 17 and the support part 19. A not-illustrated planetary gearing mechanism of a well-known type is provided and, in response to rotation of the support part 19 with respect to the housing 12, effects rotation of the additional axles 23 and 24 with respect to the support part 19. Thus, the workpiece support numbers 21 and 22 each undergo planetary movement about the primary axis 18 with respect to the housing 12. The primary axle 17, the support part 19, the additional axles 23 and 24, and the workpiece support members 21 and 22 collectively serve as a workpiece support mechanism.

Each of the workpiece support members 21 and 22 is configured to removably support a respective workpiece 41 or 42. In FIG. 1, the workpieces 41 and 42 each have a convex curved surface 43 or 44 on a lower side thereof, and have a concave curved surface 46 or 47 of similar shape on the upper side thereof. The apparatus 10 is used to form respective coatings 51 and 52 on the surfaces 43 and 44 of the workpieces 41 and 42, in a manner discussed later. In the disclosed embodiment, the workpieces 41 and 42 with the coatings 51 and 52 are each an optical component of a well-known type, such as a lens. Therefore, they are described here only briefly, to the extent necessary to facilitate an understanding of various aspects of the present invention. Further, it should be understood that the coating apparatus 10 is not limited to use for coating optical components, but instead can be used for coating any of a wide variety of other types of workpieces.

It would be possible for each of the coatings 51 and 52 to be only a single layer of a single material. But in the disclosed embodiment, the coatings 51 and 52 each happen to include a plurality of different layers, involving the use of one material for some layers, another material for other layers, and so forth. By interleaving different layers of different materials in a known manner, the coatings 51 and 52 can each be given certain desired optical and/or physical characteristics. For example, the coatings 51 and 52 may each provide an anti-reflective (AR) characteristic that causes little or no reflection of a selected range of wavelengths, such as a range corresponding to visible light.

In some cases, the multi-layer coatings 51 and 52 will be configured in a known manner to provide a combination of two or more desired characteristics. For example, a given coating might provide an anti-reflection characteristic as to radiation within one range of wavelengths, such as visible light, while also filtering out radiation in a different range of wavelengths, such as energy from a laser.

As another example, if the optical workpiece 41 or 42 happens to be made of a relatively soft material that was selected because it provides certain desirable optical properties, the coating 51 or 52 may be configured to be physically harder than the associated workpiece 41 or 42, in order to help physically protect the material of the workpiece 41 or 42. Thus, a given coating 51 or 52 may provide an anti-reflection characteristic, while also being physically harder than the material of the associated workpiece 41 or 42. The discussion here of anti-reflection characteristics, filtering characteristics and hardness characteristics is merely exemplary. The coatings 51 and 52 may each provide some or all of these characteristics, and/or any of a variety of other characteristics, separately or in combination.

The coating apparatus 10 includes a source 62 within the housing 12, in a lower portion of the chamber 13. The source 62 is spaced downwardly from the support part 19. The source 62 and the drive mechanism 31 are both controlled by a control unit 64 of a known type, which is shown diagrammatically. Although FIG. 1 shows only a single source 62, it would alternatively be possible to provide two or more sources in the apparatus 10. In the disclosed embodiment, the source 62 is spaced radially from the primary axis 18, and is positioned approximately below the path of travel of the workpiece support members 21 and 22. However, it would alternatively be possible for the source 62 to be positioned at any of a variety of other locations within the housing 12.

The source 62 is a device of a type well known in the art, and is therefore described here only briefly. More specifically, in the disclosed embodiment, the source 62 is a type of device commonly referred to as an electron beam evaporator. However, the source 62 could alternatively be any other suitable type of device. The source 62 contains two or more different materials that will be used to form respective layers in each of the multi-layer coatings 51 and 52, and the source can selectively evaporate any of these different materials. At any given point in time, the source 62 will typically be evaporating only one of the multiple materials that it contains. But in some situations, the source may simultaneously evaporate two or more of these different materials.

When the source 62 is evaporating a material, a plume of the evaporated material travels upwardly, as indicated diagrammatically by arrows 71-74. The plume 71-74 has a dispersion angle 76. The plume 71-74 from the source 62 forms a layer of the coatings 51 and 52 as the workpieces 41 and 42 pass above the source 62.

Several support wires 81-84 have their upper ends coupled to the support part 19, and extend vertically downwardly from the support part. Although four of these support wires are visible at 81-84 in FIG. 1, there could be additional support wires, for example behind the wires that are visible in FIG. 1. The workpiece support member 21 is disposed between the wires 81 and 82, and the workpiece support member 22 is disposed between the wires 83 and 84. A perforated shield 87 is coupled to and extends horizontally between the lower ends of the wires 81 and 82, and a perforated shield 88 is coupled to and extends horizontally between the lower ends of the wires 83 and 84. It would be possible for the shields to be different but, in the disclosed embodiment, the shields 87 and 88 are identical. Therefore, only the shield 87 is described below in detail.

FIG. 2 is a diagrammatic bottom view of the shield 87 and the workpiece 41, where the coating 51 has been omitted from the workpiece 41. The perforated shield 87 is a flat and approximately rectangular strip of wire mesh material. The openings between adjacent wires serve as the perforations through the shield 87. In the disclosed embodiment, the shield 87 is a stainless steel wire mesh material purchased commercially from Ferrier Wire Goods of Toronto, Ontario as type 304 wire mesh, 80×80, woven. The wires in this particular material have a diameter of about 0.0055 inches, and the space between adjacent wires is about 0.007 inches. However, it would alternatively be possible to use any other suitable perforated material, such as a suitable filter cloth.

The strip of mesh material forming the shield 87 has a length 91 that is greater than the diameter of the workpiece 41. Further, the strip has a width 92 that is less than the diameter of the workpiece 41, and that is uniform along most of the length of the strip. In FIG. 2, the width 92 is approximately one-third of the diameter of the workpiece 41. The axis of rotation 26 of the workpiece 41 intersects the shield 87 at approximately the center of the shield. Although the workpiece 41 happens to be circular, a shield similar to that shown at 87 can be used with other workpieces that have other shapes. Typically, the length of the shield would be greater than the largest transverse dimension of the workpiece (as viewed from the source 62), and the width of the shield would be less than the same transverse dimension of the workpiece.

The shield 87 has a recess 94 in one side. The inner edge of the recess 94 is arcuate. The length 96 of the recess is less than the radius of the workpiece 41. The depth 97 of the recess is less than the radius of the workpiece 41, less than half the width 92 of the shield, and less than half the length 96 of the recess. In the disclosed embodiment, the length 96 of the recess is approximately three to four times the depth 97.

As the workpiece 41 is rotated with respect to the shield 87 during a coating operation, the recess 94 will influence coating of an annular region of the workpiece. This annular region is disposed outwardly of the broken-line circle 98 and inwardly of the broken-line circle 99, where the circle 99 has a diameter greater than the diameter of circle 98, and less than the diameter of the workpiece 41.

With reference to FIGS. 1 and 2, as the plume 71-74 of coating material travels upwardly, portions of the plume will not encounter the shield 87 or 88, and will travel to and be deposited on the workpiece 41 or 42. Other portions of the plume 71-74 will encounter the shield 87 or the shield 88, but the perforations in the shield will permit a portion of that coating material to pass through the shield and then be deposited on the workpiece. The shields 87 and 88 are each sufficiently thin so that they do not tend to collimate the coating material as it flows through the perforations therein. In the disclosed embodiment, the filters 87 and 88 each pass approximately 50% of the coating material impinging on them. In experiments using the shields 87 and 88 of FIGS. 1 and 2, it was found that these shields reduced variations in the thickness of each coating layer from about 40 W to about 2%.

FIG. 3 is a diagrammatic bottom view similar to FIG. 2, but showing the workpiece 41 with a shield 187 that is an alternative embodiment of the shield 87 of FIG. 2. The shield 187 is identical in all respects to the shield 87, except that the arcuate recess 94 has been replaced with a triangular recess 194 having an inner edge that is V-shaped. The recess 194 has a depth that is approximately one-fourth of its length.

FIGS. 2 and 3 each show a perforated shield having an overall shape that is approximately rectangular, except for a single recess in one side thereof, but it would alternatively be possible to use perforated shields with a wide variety of other shapes. In general, according to one approach for designing a suitable shield, a determination is made of the degree of blocking required in the center region of a workpiece. The material of the shield is then selected with perforations that provide slightly more than this degree of blocking, for example about 10% more blocking. Then, the width of the shield is selected so that the coating thickness at the edge region of the workpiece is matched to the coating thickness at the center. Next, the shape of the shield is altered if necessary so as to even out the uniformity of the coating at points between the center and edge regions of the workpiece. (For example, this is the purpose of the recesses 94 and 194 in FIGS. 2 and 3). The shield does not need to have a shape that is straight, uniform or symmetric, so long as the shield provides the desired degree of uniformity in the resulting coating.

In the embodiments depicted in the drawings, each shield is configured so that the size and density of the perforations is approximately uniform throughout the shield. However, it would alternatively be possible to vary the sizes and/or the density of the perforations in different portions of a shield. For example, in the case of the workpiece 41 shown in FIGS. 1 and 2, a shield might have spaced first and second portions that are respectively aligned with the central and peripheral regions of the workpiece, and a third portion disposed between the first and second portions. The third portion might have perforations that are larger and/or more dense than the perforations in each of the first and second portions.

The drawings depict workpieces on which the surfaces to be coated are relatively highly curved convex surfaces. However, perforated shields can also be used to coat surfaces having a wide variety of other shapes, including but not limited to concave surfaces and flat surfaces.

Although selected embodiments have been illustrated and described in detail, it should be understood that a variety of substitutions and alterations are possible without departing from the spirit and scope of the present invention, as defined by the claims that follow.

What is claimed is:

1. An apparatus comprising:
   a workpiece;
   a source positioned spaced apart from said workpiece support and configured to emit a plume of coating material toward a workpiece support to coat said workpiece;
   said workpiece support including a workpiece support member configured to hold the workpiece, and a support part configured to rotatably support said workpiece support member for rotation about an axis that extends approximately parallel to a direction of flow of said plume away from said source; and
   a perforated shield formed of an elongate strip of mesh material that extends approximately normal to a direction of flow of said plume away from said source, said elongate strip of mesh material having an approximately rectangular shape and defining a plurality of openings that extend therethrough, said shield being supported by said workpiece support and positioned between said workpiece support member and said source, said shield having a length that is greater than a diameter of the workpiece and a width that is less than the diameter of the workpiece, said shield being positioned with respect to said source and configured to partially block a first portion of said plume from reaching said workpiece such that some of said first portion passes through said plurality of openings to reach said workpiece and a remainder of said first portion is blocked by said shield, and such that a second portion of said plume is free of influence by said shield;
   wherein said support part is configured rotatably support said workpiece support member for rotation with respect to said shield about said axis,
   wherein said elongate strip of mesh material has a recess in a length side thereof.

2. An apparatus according to claim 1, wherein said mesh material is a wire mesh material.

3. An apparatus according to claim 1, wherein said recess has a curved shape.

4. An apparatus according to claim 1, wherein said recess has a triangular shape.

5. An apparatus according to claim 1, wherein said
   a support part is configured to rotatably support said workpiece support member for rotation with respect to said shield about said axis that extends through said elongate strip of mesh material.

6. An apparatus according to claim 5, wherein said support part is supported for rotational movement with respect to said source about a principal axis that is spaced from and extends approximately parallel to the axis of rotation of said workpiece support member; and
   wherein said shield is stationarily supported on said support part for planetary movement therewith about said principal axis and for rotation with respect thereto.

7. An apparatus according to claim 1, wherein said workpiece has a curved surface oriented to be coated by coating material from said source.

8. An apparatus according to claim 1, wherein said source includes an electron beam evaporator.

9. An apparatus according to claim 1, further comprising at least one additional workpiece support member rotationally supported by said support part.

10. An apparatus according to claim 1, further comprising a plurality of support wires having upper ends coupled to said support part and lower ends coupled to said perforated shield.

* * * * *

UNITED STATES PATENT AND TRADEMARK OFFICE
CERTIFICATE OF CORRECTION

| | |
|---|---|
| PATENT NO. | : 8,293,017 B2 |
| APPLICATION NO. | : 12/101042 |
| DATED | : October 23, 2012 |
| INVENTOR(S) | : Daniel B. Mitchell |

It is certified that error appears in the above-identified patent and that said Letters Patent is hereby corrected as shown below:

In Claim 5, column 6, line 31, "a support" should be replaced with --support--.

Signed and Sealed this
Twenty-seventh Day of November, 2012

David J. Kappos
*Director of the United States Patent and Trademark Office*